United States Patent [19]

Bell, Jr. et al.

[11] 4,029,902
[45] June 14, 1977

[54] CONTIGUOUS CHANNEL MULTIPLEXER

[75] Inventors: H. Clark Bell, Jr., Sepulveda; Harold A. Rosen, Santa Monica, both of Calif.

[73] Assignee: Hughes Aircraft Company, Culver City, Calif.

[22] Filed: Oct. 22, 1975

[21] Appl. No.: 624,801

[52] U.S. Cl. .............................. 179/15 FD; 333/6; 325/3
[51] Int. Cl.$^2$ ......................................... H04J 1/08
[58] Field of Search ....... 179/15 FD, 15 FS, 15 BC; 325/3; 333/6, 10, 11, 73 W

[56] References Cited

UNITED STATES PATENTS

| | | | |
|---|---|---|---|
| 3,428,918 | 2/1969 | Matthaei | 333/6 |
| 3,453,638 | 7/1969 | Hoovler | 333/10 |
| 3,461,407 | 8/1969 | Ruggles | 333/6 |
| 3,806,838 | 4/1974 | Kitazume | 179/15 FD |
| 3,865,990 | 2/1975 | Kuenemund | 179/15 FD |

Primary Examiner—Kathleen H. Claffy
Assistant Examiner—Joseph Popek

Attorney, Agent, or Firm—D. O. Dennison; W. H. MacAllister

[57] ABSTRACT

An improved multiplexer especially adapted for combining a plurality of microwave signal channels for transmission over a common transmission path is disclosed. A single "directional filter" multiplexer structure is utilized to combine contiguous or adjacent channels without resort to odd-even channel separation or additional equalization and/or compensation networks. By purposely extending the bandpass characteristics of preselected channel filters so that either or both of their cutoff frequencies extend substantially past their associated channel band edges and well into the reflection loss regions of the adjacent channel or channels the adjacent channel mutual interaction effect is exploited. The resultant interaction between the transmission characteristics of one channel and the reflection characteristics of the adjacent channel yields an overall transmission characteristic for each channel which meets the multiplexer loss, loss slope and group delay requirements while minimizing the need for equalizing or compensating devices.

11 Claims, 18 Drawing Figures

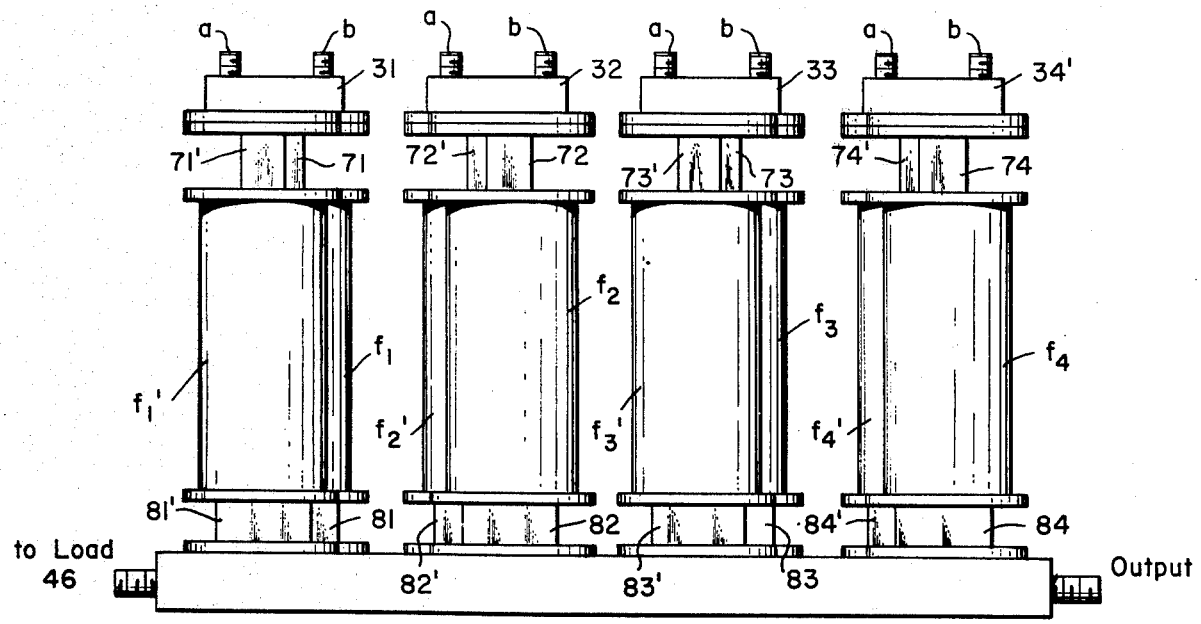
Fig. 9.
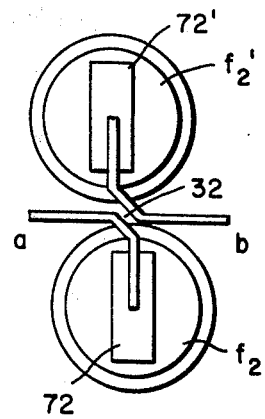
Fig. 10.
Fig. 11.
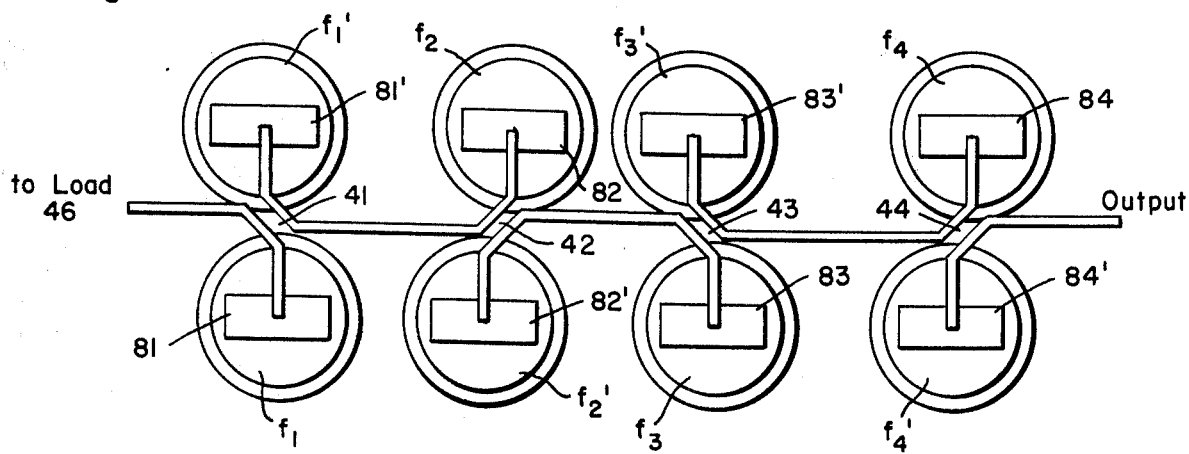

CONTIGUOUS CHANNEL MULTIPLEXER

FIELD OF THE INVENTION

This invention relates to high frequency signal-combining apparatus and more specifically to apparatus for combining the frequency-separated output signals of a plurality of signal-producing devices for transmission over a common signal transmission path.

DESCRIPTION OF THE PRIOR ART

In modern wideband communications systems, it is common to combine a plurality of signals for transmission over an extended signal wave transmission path and at the receiving end to separate these bands of frequency for subsequent processing. The techniques of combining and separating such signals are generally referred to as multilexing and demultiplexing, respectively. A great many multiplexing schemes have been proposed and are in use including both time division and frequency division techniques. The present invention is concerned with means and apparatus for frequency division multiplexing.

In a typical wideband communications system, a number of separate bandwidth-limited channels are utilized to generate, amplify or otherwise process the information containing signals. The channelization of a plurality of signals is desirable for several reasons, foremost among which is to minimize interaction and intermodulation among the many system users.

In such systems, therefore, a combination of devices generates, amplifies or otherwise processes signals extending over a first range of frequencies, a second combination of similar devices process those signals extending over a second frequency range and so on. At the output of each of the cascaded combination of devices, the signals are then combined for transmission. The combined signals are typically fed into a transmitting antenna for transmission over an extended distance whereupon they are received by a receiving antenna and demultiplexed for subsequent processing or utilization.

With regard to multiplexers, several important characteristics are necessary for optimum operation. These characteristics include the multiplexer loss, the in-band loss slope, the group delay, and the out-of-bound attenuation characteristics. The interaction between channel filters having relatively small frequency separation has made it difficult in the past to achieve a desirable combination of these characteristics. Communication multiplexers have consequently been designed to combine alternate channels of information rather than contiguous channels. That is, in the past, one output multiplexer has been utilized to combine the so-called "odd" channels and another multiplexer has been used to combine the "even" channels. Such multiplexing practice allows minimum channel-to-channel spacing and greatly alleviates undesirable interaction; however it has the disadvantage of requiring twice as many antennas or antenna modes as would otherwise be necessary. For systems in which the antennas are relatively complex, heavy and expensive, doubling their number becomes undesirable. In addition, for complex antenna coverage requirements, it is difficult to generate dual mode antenna patterns without severe degradation.

Accordingly, it is a general object of the present invention to provide a contiguous channel multiplexer.

In the past, contiguous channel multiplexers have been proposed which have been adequate for some applications. For example, in an article entitled "A Low-Loss Multiplexer for Satellite Earth Terminals," by R. W. Gruner and A. E. Williams, appearing in the *COMSAT TECHNICAL REVIEW*, Vol. 5, No. 1, Spring 1975, at pages 157–177, there is described a contiguous channel multiplexer which was designed for use in connection with satellite ground stations. The multiplexer described in this article generally displays characteristics which are satisfactory for its intended use. The described multiplexer, however, displays certain shortcomings which make it undesirable for use in applications where size and weight are important factors. In addition, the design described in the above-mentioned article displays an undesirably high loss slope and group delay over all but the last channel of the multiplexer. In most instances, it is necessary to compensate for these undesirable transmission characteristics of such a multiplexer by the use of equalizer elements; however, by so doing, additional losses, increased weight, and increased expenses are incurred.

It is another object of the present invention, therefore, to provide a contiguous channel multiplexer of simplified design.

It is yet another object of the present invention to provide a contiguous channel multiplexer having transmission characteristics which minimize the need for additional group delay equalizing elements.

One technique which has been proposed for overcoming the mutual interaction of a number of interconnected multiplexing filters is to use directional filters for each channel. In theory at least, directional filters are ideal for this application in that they can be designed for unity voltage standing wave ratio (VSWR) at all frequencies so that a number of them can be cascaded in a multiplexer structure. In general, directional filters are realized by utilizing a pair of substantially identical filters interconnected at their input and output ports by quadrature hybrid couplers. Directional filters, their properties and design have been known for some years. See for example: "Directional Channel-Separation Filters," S. B. Cohn and F. S. Coale, *PROCEEDINGS OF THE I. R. E.*, Vol. 44, No. 8, August 1956, pp. 1018–1024. When cascaded in a multiplexer structure, the reflection characteristics of the succeeding channel filters interact with the transmission characteristics of the preceding channel filters to such a degree that it still has been found necessary to utilize equalizing elements. Although the reflection characteristics of all of the succeeding channel filters interact to some degree, it is only those channels which are adjacent to one another in frequency which cause severe interaction in the passbands of the channels. So far, it has not been feasible to design such a multiplexer so that the above-mentioned interaction is acceptably small without resort to undesirably large inter-channel guard bands or odd-even channel multiplexing.

Accordingly, it is yet another object of the present invention to provide a directional filter multiplexer having selected filter pairs which are purposely tuned to utilize the effects of contiguous channel interaction thereby optimizing the overall transmission characteristics.

SUMMARY OF THE INVENTION

In keeping with the present invention, the above objects are accomplished by utilizing in each of the multiplexer channels a pair of substantially identical high selectivity filters. Each of the pairs of filters for the several channels is coupled at its input and output port by means of quadrature hybrid networks. In one embodiment, each of the filters associated with a given channel is designed so that its upper cutoff frequency extends past the desired band into and past the lower band edge of the filters of the next higher channel. By extending the upper cutoff frequency of the filters of the lower channel in this manner, purposeful interaction occurs so that the return loss interaction of the adjacent higher frequency channel is compensated.

Depending upon the order in which the plurality of channels is arranged in the multiplexer, it is also possible to achieve the desired multiplexer characteristics by extending the lower cutoff frequency of the filter of a higher channel past its band edge to purposely interact with the adjacent lower channel. In other cases, again depending upon the order in which the channels are arranged, both the upper and lower cutoff frequencies of the filter of a given channel can be extended for simultaneous compensation of the reflection characteristics of both channels adjacent thereto.

BRIEF DESCRIPTION OF THE DRAWINGS

The above-mentioned and other features and objects of the present invention will become more apparent by reference to the following description taken in conjunction with the accompanying drawings, wherein like reference numerals denote like elements and in which:

FIG. 9 is an elevation view of a four-channel output multiplexer in accordance with the present invention;

FIG. 10 is a simplified top plan view of one of the input sections of the multiplexer of FIG. 9;

FIG. 11 is a simplified bottom plan view illustrating the output hybrid coupling from the embodiment of FIG. 9.

DESCRIPTION OF THE PREFERRED EMBODIMENTS

Figure 1A:
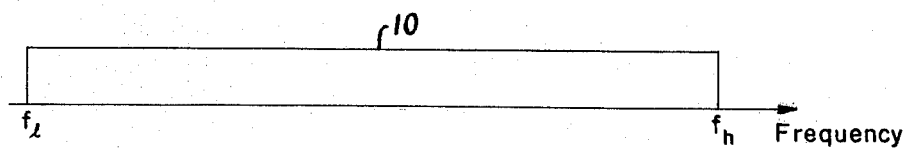
FIGS. 1a and 1b are graphical representations of a band of frequencies which has been channelized in accordance with the prior art practice.
Figure 1B:
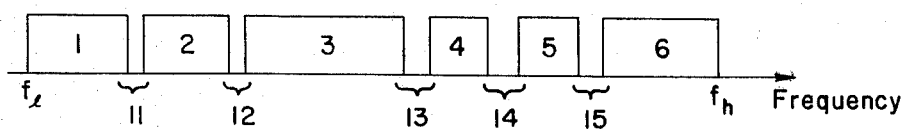

In FIG. 1a, curve 10 depicts a band of frequencies extending from a lower frequency $f_1$ to an upper frequency $f_h$. As mentioned hereinabove, for many communications purposes it is advantageous to channelize such a wide range of frequencies for more advantageous amplification and/or processing. In FIG. 1b, the band of frequencies between $f_1$ and $f_h$ has been divided into six channels denoted channels 1 through 6. In practice, the upper frequency limit of a given channel (such as channel 1) may extend to the lower frequency limit of the next higher channel (i.e., channel 2) and so on. Generally, however, it is expedient to allow a small guard band between channels. In FIG. 1b, the guard band between channels 1 and 2 is depicted by the numeral 11; the guard band between channels 2 and 3 is denoted by the numeral 12; and so on up to numeral 15 which denotes the guard band between channels 5 and 6. Quite often, all of the several channels will be of the same bandwidth. It is also common that the guard bands between channels are of the same width. In FIG. 1b, however, the more generalized case is shown wherein each of the channels has a different bandwidth, and the guard band between channels is also different.

If it is assumed that each of the channels 1 through 6 depicted in FIG. 1b represents a plurality of information-containing high frequency signals, then the following description becomes more meaningful. As mentioned hereinabove, the signals within a given channel are generated, amplified, or otherwise processed by a cascaded combination of high frequency devices with each combination of devices having operating bandwidths which coincide with the bandwidths of the respective channels. Typically, such processing equipment includes a broadband amplifier, such as a traveling wave tube (TWT) in addition to its associated input and output devices, level-setting attenuators and so on. Having been processed, the several information channels are then coupled to a transmission path for transmission to the receiving terminal.

Figure 2:
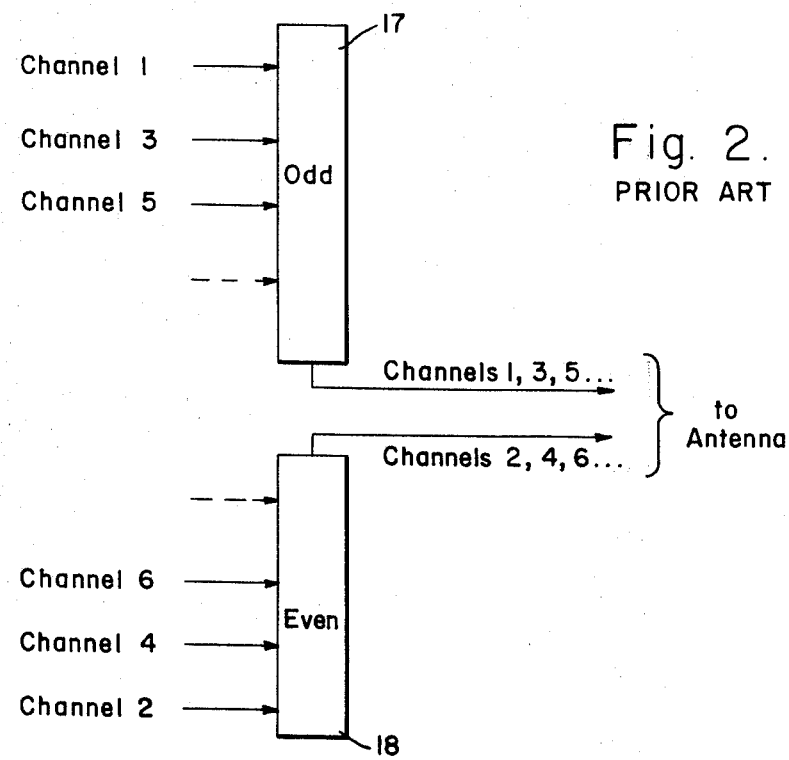
FIG. 2 is a simplified block diagram of a typical output multiplexer in accordance with the teachings of the prior art.

In FIG. 2, there is shown in block diagram an output multiplexer for combining the outputs of a plurality of signal channels. In accordance with the teachings of the prior art, the output multiplexer of FIG. 2 is divided into two portions. The top portion 17 of the output multiplexer combines the odd channels 1, 3, 5 . . . , and the lower portion 18 of the multiplexer combines the even numbered channels 2, 4, 6 and so on. The odd and even channels thus combined are then transmitted to an antenna feed means (not shown) by conventional transmission media, such as waveguides or coaxial transmission lines. In general, the even-numbered channels are fed into one antenna, and the odd-numbered channels are fed into a second antenna. In some applications, it is possible to use dual polarization in the antenna feed arrangement with a single reflector.

In the past, output multiplexers suitable for use in wideband communications have taken one of several general forms. One form of output multiplexer utilizes a plurality of bandpass filters arranged such that each frequency-separated channel is coupled into a common waveguide or manifold through the bandpass filter where it propagates toward the output end. Division of the signals in each of the bands of frequencies may be prevented by means of bandstop filters in the multiplexer. As pointed out by Gruner and Williams in their above-cited article, however, extremely high selectivity filters are required in order to minimize the interaction and tuning problems. This results in high dissipative losses, extra weight, bulk, and expense. For these reasons, therefore, the prior art output multiplexers have generally comprised two portions, as shown in FIG. 2 — one portion for combining the odd channels, and one portion for combining the even channels.

Figure 3A:
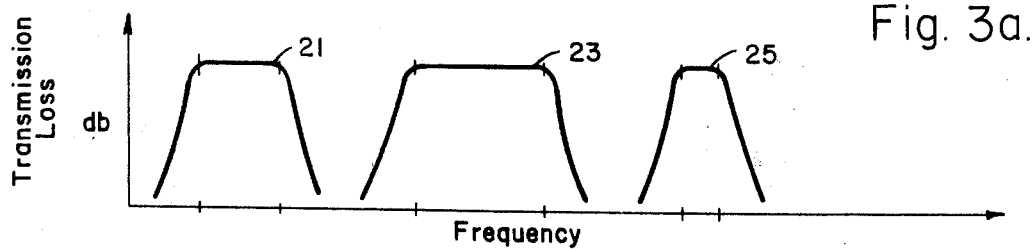
FIGS. 3a and 3b are graphical representations of the bandpass characteristics of the output multiplexer of FIG. 2.
Figure 3B:
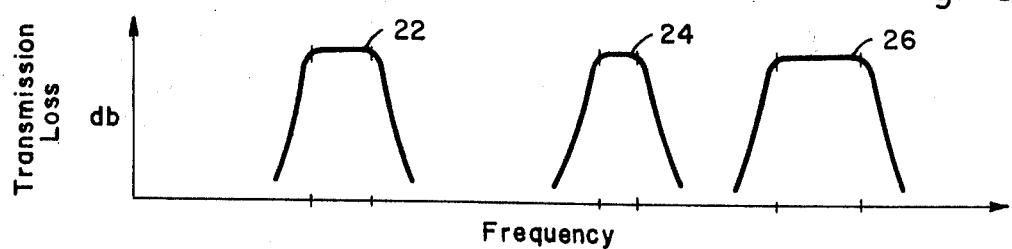

In FIG. 3a, there is shown the relative transmission loss characteristics of the odd channel portion 17 of the output multiplexer of FIG. 2. The curves 21, 23 and 25 represent the transmission loss characteristics of that portion of the multiplexer corresponding to channels 1, 3 and 5. In FIG. 3b, the transmission loss characteristics of the even channel portion of the multiplexer of FIG. 2 are shown. Curves 22, 24 and 26 represent the transmission loss characteristics for channels 2, 4 and 6, respectively. Because of the relatively wide separation (additional guard band, as it were) between the non-contiguous odd channels or non-contiguous even channels, the effects of mutual interaction are negligible. As previously mentioned, however, the multiplexing scheme of FIG. 2 requires either two separate transmitting antennas — one for the odd channels and one for the even channels — or it requires additional hardware for creating orthogonal modes with a single antenna structure. In either event, the full capability of the antennas and associated feed hardware is not utilized. For that reason, it is highly desirable to utilize a multiplexer which is capable of multiplexing contiguous output channels in a single structure for coupling to a single antenna.

Figure 4:
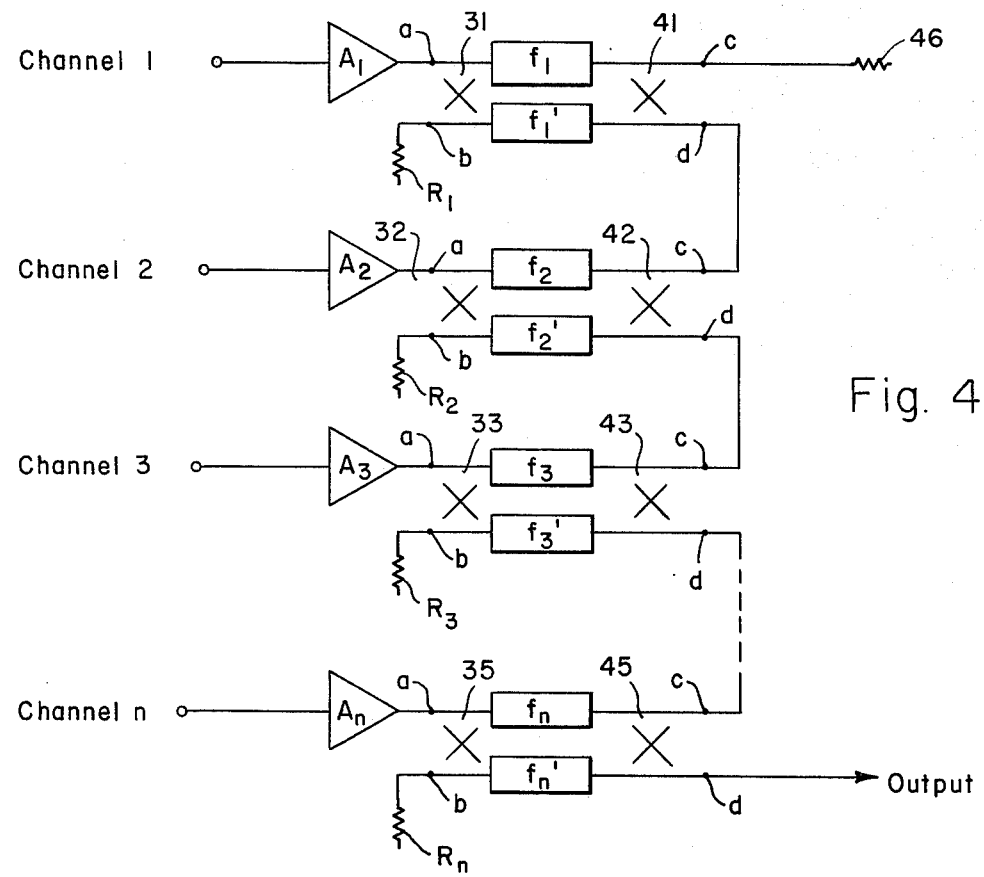
FIG. 4 is a block diagram of a multiplexer in accordance with the teachings of the present invention.

In FIG. 4, there is shown in block diagram an output multiplexer structure which can be adapted for contiguous channel multiplexing. The multiplexer arrangement of FIG. 4 is generally termed a quadrature hybrid multiplexer for reasons which will become more apparent hereinbelow. Basic to the multiplexer structure of FIG. 4 are a pair of substantially identical bandpass filters for each channel to be multiplexed. Filters $f_1$ and $f_1'$ comprise the filters for channel 1; filters $f_2$ and $f_2'$ comprise the filters for channel 2; filters $f_3$ and $f_3'$ comprise those for channel 3; and $f_n$ and $f_n'$ denote the filters for the nth channel of the multiplexer. The input ports of each of the pairs of filters for each channel are interconnected by means of quadrature hybrid couplers. The inputs of filters $f_1$ and $f_1'$ are interconnected by means of quadrature hybrid coupler 31; the inputs of filter $f_2$ and $f_2'$ are interconnected by means of quadrature hybrid coupler 32; the input ports of filters $f_3$ and $f_3'$ are interconnected by means of quadrature hybrid coupler 33; and the inputs of filters $f_n$ and $f_n'$ are interconnected by means of quadrature hybrid coupler 35. In a similar manner, the output ports of each of the pairs of filters for each channel 1 through $n$ are connected by means of quadrature hybrid couplers 41, 42, 43 and 45, respectively.

The signals to be multiplexed are derived from appropriate signal-generating or processing equipment indicated by amplifiers $A_1$, $A_2$, $A_3$ and $A_n$ for the respective channels. It is noted that the various amplifiers are not part of the multiplexer structure, but rather illustrate a possible source of signals for the multiplexer inputs. As a mater of practice, the input signals are ordinarily derived from prior stages which do comprise broadband amplifiers such as traveling wave tubes.

The operation of the embodiment of FIG. 4 may be more readily understood if the input and output ports of the dual filter-quadrature hybrid combinations are designated. For this purpose, the input ports are $a$ and $b$. The output ports are designated $c$ and $d$. The output ports of amplifiers $A_1$, $A_2$, $A_3$ and $A_n$ are coupled to input ports $a$ of the filter-coupler combinations of channels 1, 2, 3 and $n$, respectively. Ports $b$ of each of the filter-coupler combinations are terminated by reflectionless load impedances $R_1$, $R_2$, $R_3$ and $R_n$ for each of the respectively numbered channels.

At the output side, output port $c$ of the filter-coupler of channel 1 is likewise terminated in a reflectionless load impedance 46. Output port $d$ of channel 1 is connected to output port $c$ of channel 2; output port $d$ of channel 2 is connected to output port $c$ of channel 3; and output port $d$ of channel 3 is coupled, through possible additional stages indicated by the dotted line, to output port $c$ of channel $n$. Output port $d$ of channel $n$ comprises the multiplexer output.

Due to the nature of the quadrature hybrid couplers, a signal entering port $a$ reaches the two filters of that channel at equal power but with quadrature phase. Although the two signal components are substantially transmitted through the filters, due to inevitable circuit imperfections they are partially reflected; the ratio of the reflected-to-transmitted energy, in turn depending upon the frequency of the signals and the tuning of the filters. The reflected components of the signals add in phase at port $b$ where they are absorbed in the matched load and are in phase opposition and, therefore, cancel at port $a$. This property provides a wideband match at the input port $a$ of the hybrid coupler-dual filter assembly. The components of the signal transmitted through the two filters cancel at port $c$ whereas they add in phase at port $d$. The signals thus combined at port $d$ then propagate toward port $c$ of the next hybrid coupler-dual filter assembly.

If a signal is introduced at output port $c$, it reaches the two filters of that channel at equal power and quadrature phase where each is partially reflected and partially transmitted. The reflected components add in phase at port $d$ where they again propagate toward port $c$ of the next higher frequency channel. The transmitted components add in phase at port $b$ where they are again absorbed in the matched load and are isolated from port $a$.

Consider a typical signal transmission through the channel 1 portion of the multiplexer of FIG. 4. Such a signal entering from the output of amplifier $A_1$ and propagating to the multiplexer output is affected by the in-band transmission properties of filters $f_1$ and $f_1'$ and the out-of-band reflection properties of the filter assemblies for channels 2, 3, . . . $n$. The transmission loss for this channel 1 signal is given by the expression $|T_1 \rho_2 \rho_3 \ldots \rho_n|^2$, where T is the voltage transmission coeffeicient of a quadrature hybrid-dual filter combination and $\rho$ is its voltage reflection coefficient. Each succeeding channel signal sees only the reflection loss of the succeedingly higher frequency channels until at channel $n$, the transmission loss is merely $|T_n|^2$. For practical purposes, the reflection coefficient $\rho$ is very nearly unity at frequencies more than one channel width away from a band edge; and therefore, the transmission losses for signals in the passbands of the several channels can be simplified as follows: For channel 1, $|T_1 \rho_2|^2$; for channel 2, $|T_2 \rho_3|^2$; for channel 3, $|T_3 \rho_4|^2$; and for channel $n$, $|T_n|^2$.

Figure 5A:
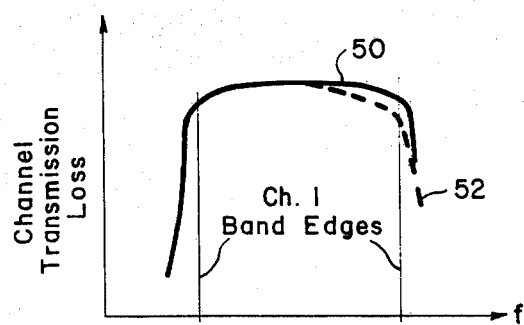
FIGS. 5a and 5b are typical channel transmission loss characteristics and channel group delay characteristics for one channel of the multiplexer of FIG. 4 without compensation.
Figure 6A:
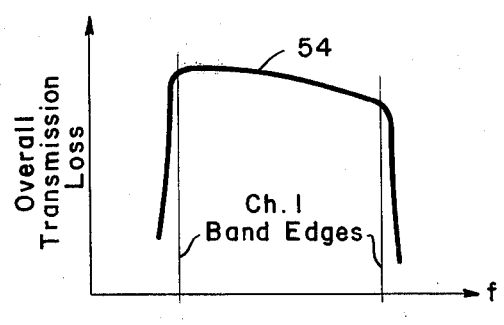
FIGS. 6a and 6b are the overall transmission loss and overall group delay characteristics for the uncompensated single channel illustrated by the graphs of FIGS. 5a and 5b.
Figure 5B:
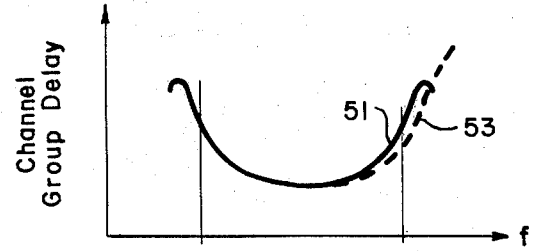
Figure 6B:
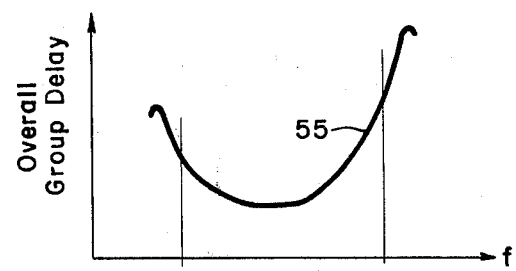

The preceding expressions represent what has generally been regarded as the undesirable multiplication of the transmission coefficient by the adjacent channel reflection coefficient. The graphical representations of FIGS. 5a, 5b, 6a and 6b illustrate these relationships more clearly. In FIG. 5a, there is shown by curve 50 the channel transmission loss $T_1$ of typical channel 1. The group delay corresponding to curve 50 is given by curve 51 of FIG. 5b and on the same frequency scale. As can be seen, both curves 50 and 51 illustrate $T_1$ with acceptable loss slope and group delay characteristics; however, when the reflection losses $\rho_2$ are considered, the channel transmission and group delays are altered. In FIGS. 5a and 5b, the dotted curves 52 and 53 represent the contributions of the adjacent channel 2 voltage reflection coefficient to the channel transmission and group delay, respectively. The resultant transmission loss group delay for the channel 1 signal at the output of the multiplexer are given by curves 54 and 55 in FIGS. 6a and 6b, respectively. Whereas this added delay and loss at the upper band edge can be compensated as mentioned hereinabove, the additional weight, power loss, bulk and expense is undesirable.

Figure 7A:
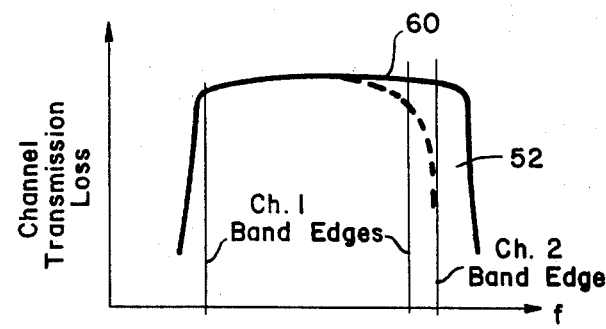
FIGS. 7a and 7b are graphical representations of the single channel transmission loss characteristics and single channel group delay characteristics of an output multiplexer designed in accordance with the teachings of the present invention.
Figure 8A:
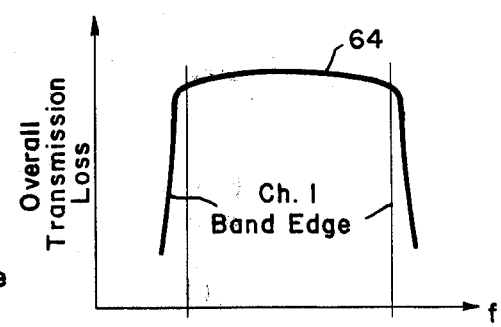
FIGS. 8a and 8b are graphical representations of the overall single channel transmission loss characteristics and overall single channel group delay characteristics of the output multiplexer of the present invention.
Figure 7B:
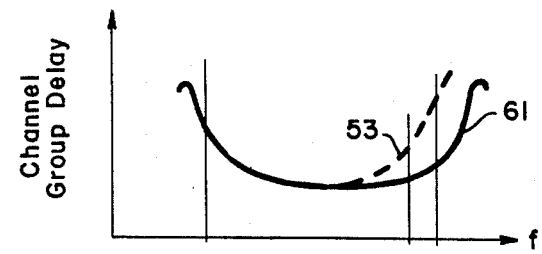
Figure 8B:
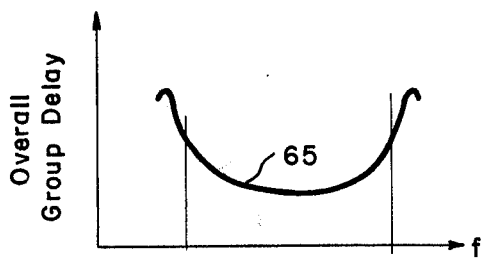

In keeping with the present invention, the upper cutoff frequencies of filters $f_1$ and $f_1'$ are increased substantially beyond the upper band edge of channel 1 — in fact, with a relatively narrow guard band between channels even past the lower band edge of channel 2. The resultant curves of the expaneded transmission coefficient $T_1'$ and group delay are shown graphically by curves 60 and 61 of FIGS. 7a and 7b, respectively. Again, the contributions of the adjacent channel 2 reflection coefficient to the transmission and group delay are shown by curves 52 and 53, respectively. When these contributions are multiplied, the resultant overall transmission loss for a channel 1 signal through the multiplexer is narrowed so that it thereby conforms to the desired characteristic shown by curve 64 of FIG. 8a. The overall group delay similarly conforms to the desired characteristic shown by curve 65 of FIG. 8b.

It is apparent, of course, that the filters $f_2, f_2'; f_3, f_3';$ . . . are also designed so that their upper cutoff frequencies extend past the upper band edges of their respective channels. Only filters $f_n$ and $f_n'$ of the highest frequency channel of the multiplexer are designed so that their cutoff frequencies coincide with the channel band edges. This is due to the previously-mentioned fact that a channel $n$ signal is not affected by the presence of the next higher hybrid-filter combination, since there is none.

It is noted that the same principle can be applied to extend the transmission characteristics in other than the upper frequency direction. For example, if channel 1 of the miltiplexer of FIG. 4 were the highest frequency channel and channel $n$ were the lowest, then it would be the lower frequencies of each filter (except $n$) which would be extended. It is even possible to extend both the upper and lower cutoff frequencies of a given channel, if it is followed in the multiplexer structure by interacting channels which are adjacent to it on both sides.

It is thus seen that by redesigning the transmission characteristics of the filters at the band edge at which the interaction occurs to extend well into the adjacent interacting band, the overall transmission characteristics are greatly improved. This minimizes the rise in group delay and gain slope associated with the transmission coefficient so that when combined with the reflection coefficient, the overall characteristics are symmetric and sufficiently low across the channel bandwith. The required out-of-band attenuation at the affected band edge in this design is supplied, in part, by the interacting filter which directs a portion of the out-of-band signals into its matched load impedance R.

A practical embodiment of the present invention has been constructed in accordance with the principles of the invention and is shown in the slightly simplified elevation and top and bottom plan views of FIGS. 9, 10 and 11. Referring more specifically to FIG. 9, a four-channel quadrature hybrid multiplexer is shown. For the sake of clarity, the structure designators for the various multiplexer components have been carried over from FIG. 4 where appropriate.

In FIG. 9, filters $f_1, f_1', f_2, f_2', f_3, f_3', f_4$ and $f_4'$ are shown as cylindrical coupled cavity filters. For the sake of clarity, the various external coupling and adjusting screws have been omitted. In practice, elliptic-function or quasi-elliptic-function filters of prior art and design can be utilized. The detailed design of such coupled cavity filters can be found in an article by A. E. Atia and A. E. Williams entitled "Narrow-Bandpass Waveguide Filters," IEEE TRANSACTIONS ON MICROWAVE THEORY AND TECHINIQUES, Vol. MTT-20, No. 4, Apr. 1972, at ppg. 258-265.

The input ports, output ports and intermediate terminated ports are depicted as coaxial fittings. Input ports $a$ and $b$ of channel 1 are coupled to hybrid coupler 31. The outputs of hybrid coupler 31 are coupled through input transition sections 71 and 71' into filters $f_1$ and $f_1'$, respectively. The outputs of the filters are coupled through output transition sections 81 and 81' into quadrature hybrid coupler 41. The same order of assembly is shown for channels 2, 3 and 4 with the input quadrature hybrid of channel 4 being designated 34. The input transition sections 72, 72'; 73, 73'; 74, 74', and the output transition sections 82, 82'; 83, 83'; 84, 84' correspond to channels 2, 3 and 4, respectively.

In FIG. 9, only the external portion or housing is shown for the input and output quadrature hybrid couplers. In the experimental embodiment, so-called "square-ax" TEM transmission lines have been utilized to further reduce the size, weight and complexity of the multiplexer. FIG. 10 illustrates the inner conductors of the input guadrature hybrid coupler 32 in a simplified top plan view of FIG. 9. The outer conductors and housing has been omitted for the sake of clarity. The hybrid coupler 32 is that section of closely coupled line between the two cavities. The design of such quadrature hybrid couplers is known in the art. The transition sections 71 and 71' are utilized to convert the energy in the TEM mode in the hybrid coupler to the proper waveguide mode for coupling into cavities $f_2$ and $f_2'$.

The use of square-ax or other forms of TEM line hybrids rather than the waveguide hybrids results in greatly improved packaging convenience highly desirable for satellite applications. In addition, these devices provide a wider band match than comparable waveguide quadrature hybrid couplers thereby avoiding the necessity of utilizing isolators between each of the output amplifiers and the multiplexer.

The output quadrature hybrid couplers and the transmission lines interconnecting them are also of square-ax construction. Again in the bottom plan view of FIG. 11, the outer conductors and housing of the line have been omitted. The output lines from the first filter section, for example, emerge from output transition sections 81 and 81' and proceed to the coupled quadrature hybrid 41. The conductor emerging to the left comprises the isolated multiplexer output which is connected to load impedance 46, not shown. The line emerging to the right enters quadrature hybrid coupler section 42 and so on as shown schematically in FIG. 4. The output of the multiplexer is derived from the output of hybrid coupler 44.

Figure 12:
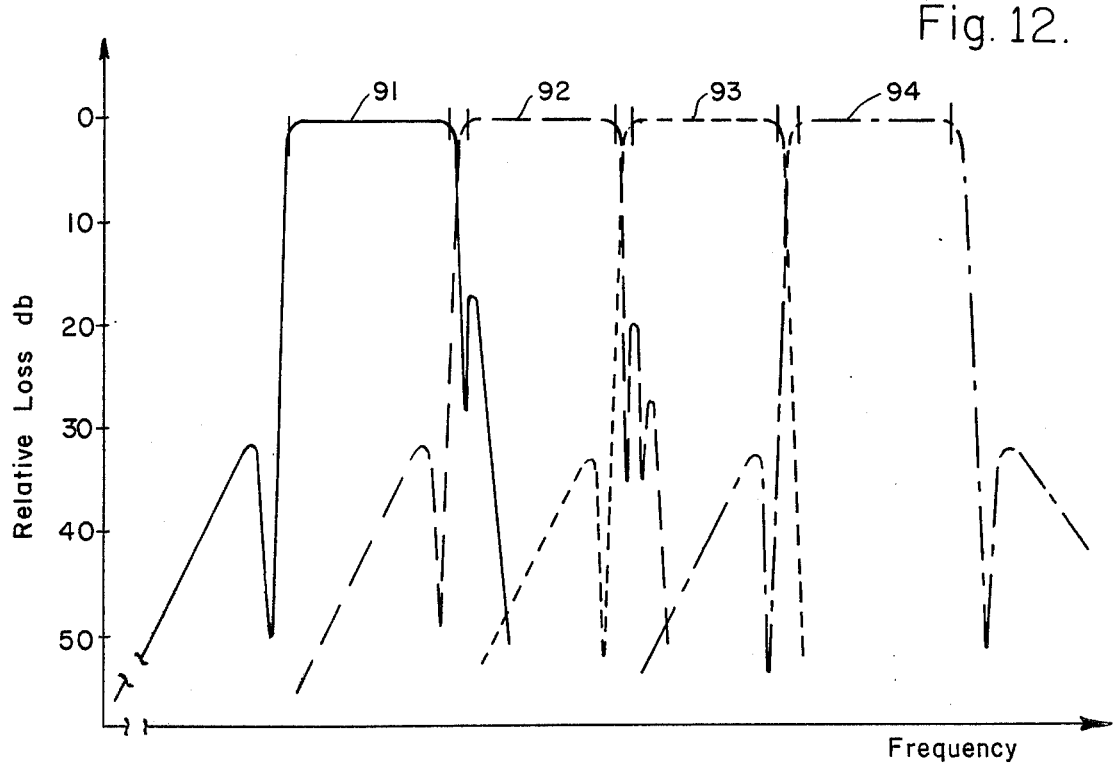
FIG. 12 is a graphical representation of the relative loss versus frequency characteristics of the output multiplexer of FIG. 9.

In FIG. 12 there is shown graphically the relative loss versus frequency curves of all four channels of the multiplexer of FIGS. 9, 10 and 11. Curve 91 depicts the relative loss in dB of channel 1. Curves 92, 93 and 94 depict the relative loss curves of channels 2, 3 and 4, respectively. Channel 1 occupies the band of frequencies between 3.704 GHz and 3.781 GHz; channel 2 covers 3.789 to 3.861 GHz; channel 3 covers 3.869 to 3.941 GHz and channel 4 covers 3.959 to 4.031 GHz. The 3 dB points of the respective channel relative loss curves correspond to these frequencies.

In all cases it is understood that the above-described embodiments are merely illustrative of but a small number of the many possible specific embodiments which can represent applications of the principles of the present invention. Numerous and varied other arrangements including other forms of directional filters can be readily devised in accordance with these principles by those skilled in the art without departing from the spirit and scope of the invention.

We claim:

1. A multiplexer of the type comprising a plurality of directional filters each having at least one input port and an output port, said input ports being adapted to receive signals extending over predetermined bands of frequencies, said filter output ports being connected in a cascaded transmission path to a multiplexer output port, the transmission characteristics of said multiplexer from the respective input ports of a given filter to said multiplexer output port being a function of the transmission coefficient of that filter and the reflection coefficient of the succeeding filters along said transmission path, the improvement comprising the extension of at least one of the cutoff frequencies of preselected ones of said filters into the bandpass region of a channel next adjacent thereto in frequency.

2. An improved signal multiplexer comprising, in combination:
   a plurality of input signals, said input signals being divided into separate channels, with each of said channels having a lower band edge and an upper band edge, the upper band edges of each channel being substantially adjacent the lower band edge of a next succeeding channel;
   a plurality of directional filters, each of said directional filters having at least one input port and a pair of output ports;
   means for coupling one channel of said input signals to the input port of a respective one of said directional filters;
   means for coupling the output ports of said directional filters in cascade, an output port of the last filter of said plurality of filters being coupled to the output port of said multiplexer; and
   the pass band frequencies of preselected ones of said plurality of directional filters extending substantially beyond at least one of the band edges of the channel of input signals coupled thereto.

3. The multiplexer according to claim 2 wherein said input signal channels are coupled to the input ports of said filters in order of ascending frequency and the pass band frequencies of said preselected ones of said filters extend beyond the upper band edges of the channel of input signals coupled thereto.

4. The multiplexer according to claim 2 wherein each of said directional filters comprises a pair of substantially identical bandpass filters having their input ports and output ports respectively interconnected by means of first and second quadrature hybrid couplers.

5. The multiplexer according to claim 4 wherein said filters are of the quasi-elliptic-function type.

6. The multiplexer according to claim 4 wherein each of said quadrature hybrid couplers comprises coupled sections of TEM transmission line.

7. An improved signal multiplexer comprising, in combination:
   a plurality of input signals, said input signals being divided into separate channels defined by upper and lower band edges;
   a plurality of directional filters, each of said directional filters having at least one input port and a pair of output ports;
   means for coupling each of said channels of input signals to an input port of a respective one of said directional filters;
   means for coupling the output ports of said directional filters in cascade, an output port of the last filter of said plurality of filters comprising the output port of said multiplexer;
   the transmission characteristics of a given one of said signal channels being substantially a function of the transmission coefficient of the filter associated with said given channel and the reflection coefficient of those channels adjacent thereto in frequency and following said channel in said multiplexer; and
   means for altering the transmission loss characteristics of preselected ones of said signal channels by extending the transmission coefficient of the filter associated with said preselected channel past its associated channel band edge and into an adjacent channel.

8. The multiplexer according to claim 7 wherein said channels of input signals are coupled to the input ports of said filters in order of ascending frequency and the transmission loss characteristics of preselected ones of lower frequency channels are altered by extending the transmission coefficient of the filter associated therewith substantially past its upper channel band edge into an upper adjacent channel.

9. The multiplexer according to claim 7 wherein each of said directional filters comprises a pair of substantially identical bandpass filters having their input ports and output ports respectively interconnected by means of first and second quadrature hybrid couplers.

10. The multiplexer according to claim 9 wherein said filters are of the quasi-elliptic-function type.

11. The multiplexer according to claim 9 wherein each of said quadrature hybrid couplers comprises coupled sections of TEM transmission line.

* * * * *